United States Patent [19]

Ashuri

[11] Patent Number: 5,652,530
[45] Date of Patent: Jul. 29, 1997

[54] METHOD AND APPARATUS FOR REDUCING CLOCK-DATA SKEW BY CLOCK SHIFTING

[75] Inventor: Roni Ashuri, Zichron Yaakov, Israel

[73] Assignee: Intel Corporation, Santa Clara, Calif.

[21] Appl. No.: 536,373

[22] Filed: Sep. 29, 1995

[51] Int. Cl.⁶ .................................................. H03K 19/096
[52] U.S. Cl. ................................................................ 326/93
[58] Field of Search ..................................... 326/93, 95, 98; 327/141, 161, 525; 375/359, 371, 373, 354; 370/108, 503

[56] References Cited

U.S. PATENT DOCUMENTS

| | | | |
|---|---|---|---|
| 4,358,741 | 11/1982 | Nardin | 327/161 |
| 4,814,640 | 3/1989 | Miyake | 327/525 |
| 4,839,907 | 6/1989 | Saneski | 375/113 |
| 5,043,596 | 8/1991 | Masuda et al. | 327/295 |
| 5,122,693 | 6/1992 | Honda et al. | 326/93 |
| 5,259,006 | 11/1993 | Price et al. | 375/107 |
| 5,283,631 | 2/1994 | Koerner et al. | 326/21 |
| 5,307,381 | 4/1994 | Ahuja | 327/292 |
| 5,361,277 | 11/1994 | Grover | 327/141 |
| 5,432,823 | 7/1995 | Gasbarro et al. | 375/356 |
| 5,572,557 | 11/1996 | Aoki | 327/161 |

*Primary Examiner*—Edward P. Westin
*Assistant Examiner*—Benjamin D. Driscoll
*Attorney, Agent, or Firm*—Blakely, Sokoloff, Taylor & Zafman

[57] ABSTRACT

A data signal is input into an integrated circuit and the data signal is transmitted through a series of logic gates that cause a propagation delay. An external clock line associated with the data signal is also inputted into the integrated circuit. The external clock signal is passed through a delay shifter that adds a controllable amount of delay to the clock signal. The amount of delay added to the clock signal should equal the total amount of propagation delay added to the data signal. The clock signal is then also transmitted through a phase-lock loop to stabilize the clock signal. The delayed internal clock signal is then used to clock the data signal which has been transmitted through a series of logic gates that have added propagation delay. Since the internal clock signal has been delayed an equal amount as the data signal, the data signal will be clocked at an appropriate time.

13 Claims, 5 Drawing Sheets

METHOD AND APPARATUS FOR REDUCING CLOCK-DATA SKEW BY CLOCK SHIFTING

FIELD OF THE INVENTION

The present invention relates to the field of clock signals in integrated circuits. Specifically, the present invention comprises a delay unit for an internal clock signal that delays the internal clock signal such that there is sufficient time for input data signals to pass through logic which causes a delay and be caught correctly clocked.

BACKGROUND OF THE INVENTION

As an electrical data signal passes through the logic gates in an integrated circuit there is a certain amount of propagation delay that slows the data signal down. The propagation delay of a particular logic gate is the amount of time that the data signal is delayed as it transmits through the particular logic gate. When a data signal is transmitted through a large number of logic gates thus causing a large amount of delay on the data signal, then the data signal may no longer match up to its associated clock signal. If this situation occurs, when the data is later sampled at a flip-flop using the associated clock signal, the data signal may be sampled at the wrong time. For example, if a data signal goes through a large number of logic circuits before it is sampled at a flip-flop, the data signal may not be ready by the time the flip-flop samples the data signal. In such a case the wrong data signal may be sampled. It would thus be desirable to implement a circuit that would ensure that a delayed data signal is sampled at an appropriate time.

SUMMARY AND OBJECTS OF THE INVENTION

It is therefore an object of the present invention to provide a circuit to ensures that a data signal which is delayed by propagation delays is sampled at an delayed time.

It is a further object of the present invention to have an adjustable circuit that will accommodate different amounts of propagation delay on a data signal.

These and other objectives are disclosed in the clock shifter circuit of the present invention. A data signal is input into an integrated circuit and the data signal is transmitted through a series of logic gates that cause a propagation delay. An external clock line associated with the data signal is also inputted into the integrated circuit. The external clock signal is passed through a delay shifter that adds a controllable amount of delay to the clock signal. The amount of delay added to the clock signal should equal the total amount of propagation delay added to the data signal. The clock signal is then also transmitted through a phase-lock loop to stabilize the clock signal. The delayed internal clock signal is then used to clock the data signal which has been transmitted through a series of logic gates that have added propagation delay. Since the internal clock signal has been delayed an equal amount as the data signal, the data signal will be clocked at an appropriate time.

Other objects, features, and advantages of the present invention will be apparent from the accompanying drawings and from the detailed description which follows below.

BRIEF DESCRIPTION OF THE DRAWINGS

The objects, features, and advantages of the present invention will be apparent from the following detailed description of the preferred embodiment of the invention with references to the following drawings.

DETAILED DESCRIPTION

A method and apparatus for clock shifting in a digital semiconductor digital integrated circuit is disclosed. In the following description, for purposes of explanation, specific nomenclature is set forth to provide a thorough understanding of the present invention. However, it will be apparent to one skilled in the art that these specific details are not required in order to practice the present invention. In other instances, well known circuits and devices are shown in block diagram form in order not to obscure the present invention.

Figure 1:
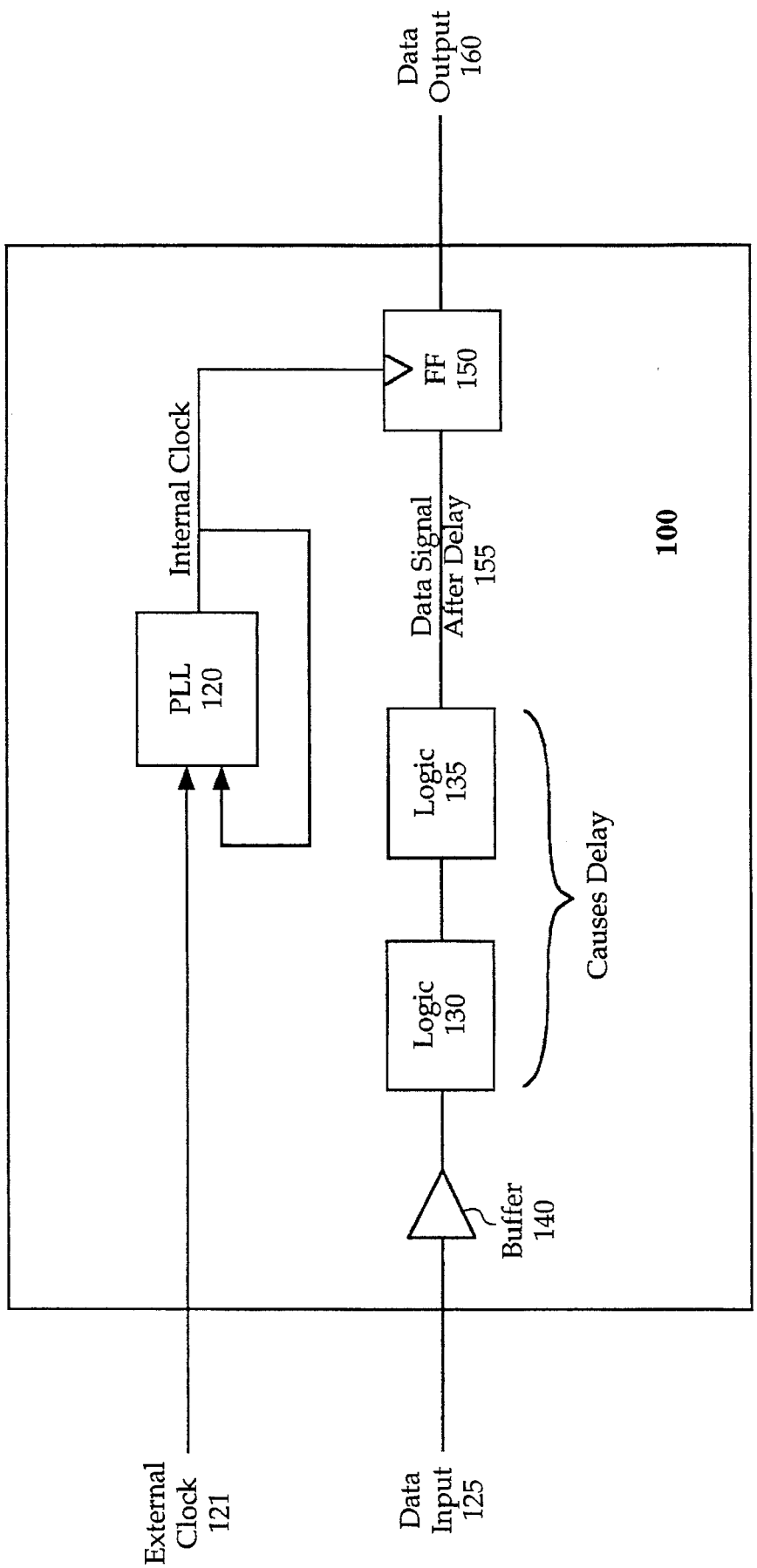
FIG. 1 illustrates a block diagram of a typical integrated circuit.

FIG. 1 illustrates an exemplary digital integrated circuit. In the digital integrated circuit of FIG. 1 a data input line 125 is input into the integrated circuit. The data signal from the data input line 125 first passes through input buffer 140. The data signal then passes through logic 130 and logic 135. While the data signal is being transmitted through logic 130 and logic 135 a certain amount of propagation delay is added to the data signal. At flip-flop 150, the delayed data signal is sampled by flip-flop 150.

Accompanying the data input signal 125 is an external clock line 121. The data signal on data input 125 is set and held according to the clock signal on external clock line 121. The clock signal is passed through a phase lock loop 120 to stabilize it. The stabilized internal clock signal is used to clock flip-flop 150 that samples the delayed data signal.

Figure 2:
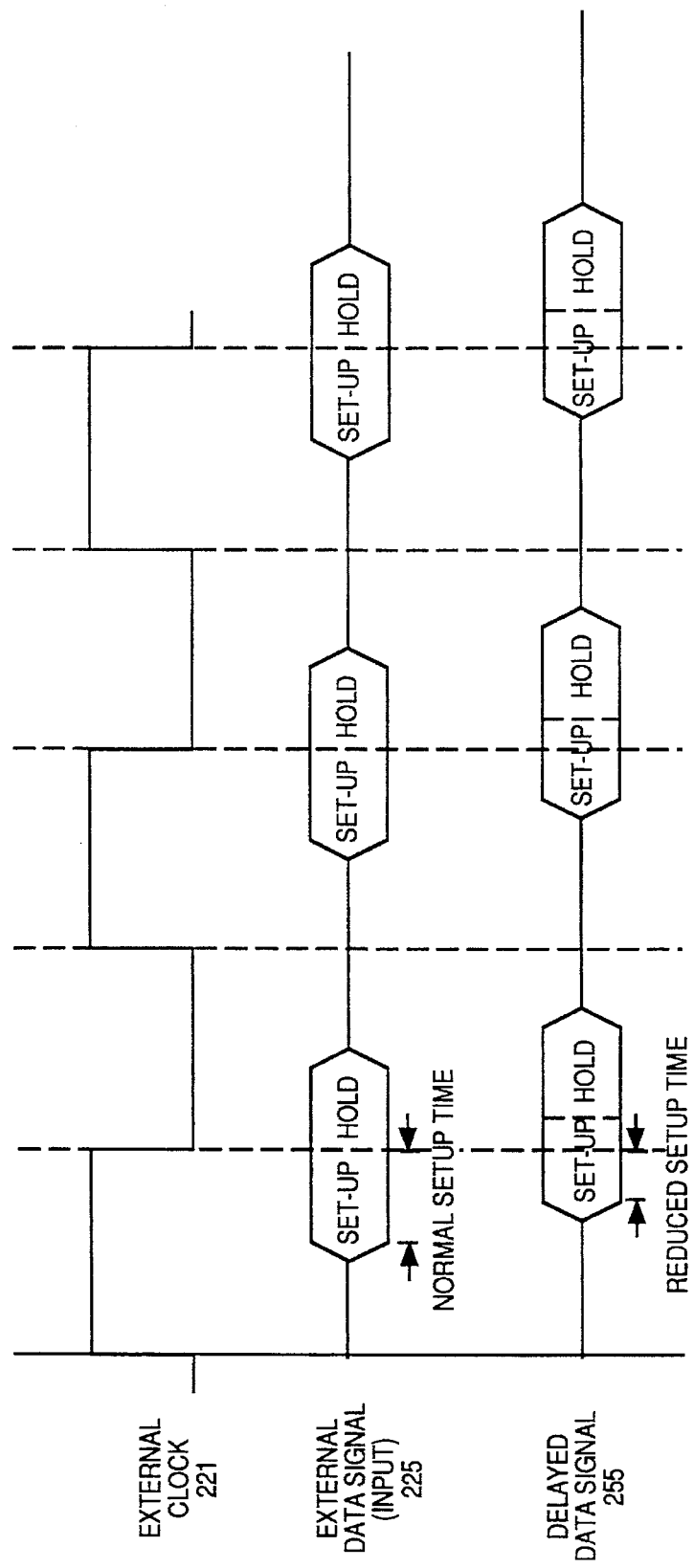
FIG. 2 illustrates a timing diagram of how the clock signal and data signal of FIG. 1 appear.

FIG. 2 illustrates a timing diagram explaining the time of the signals generated in the circuit of FIG. 1. The external clock signal 221 is the clock signal that is transmitted on external clock line 121 of FIG. 1. The clock signal consists of a series of paired clock phases. There is a high clock phase and a low clock phase during each clock cycle. External data signal 225 of FIG. 2 corresponds to the data signal that is put on the data input line 125 of FIG. 1. The external data signal 225 is set up during the first phase of each clock cycle. After the set up period, the external data signal 225 is then held for sampling during the second phase of the clock cycle. Normally, the data signal is sampled by a receiving circuit during the second phase of the clock cycle as illustrated by external data signal 225 in FIG. 2.

Referring back to FIG. 1, the input buffer 140, the logic 130 and logic 135 all add a certain amount of propagation delay to the data signal on data input line 125. The delayed data signal 255 in FIG. 2 illustrates how the data signal 225 from the data input line 125 of FIG. 1 appears after the propagation delay effects of input buffer 140, the logic 130 and logic 135 have been applied. As illustrated in the timing diagram of FIG. 2, the delayed data signal 255 is shifted significantly relative to the external clock signal 221 that has not gone through any type of circuits that have any significant amount of delay. As illustrated in FIG. 2, the time available to set up the delayed data signal 255 has been reduced. In some cases, the set-up time may be too small to accurately generate the signal. If the data signal is delayed far enough, the data signal may be not be ready. If the data signal is sampled while it is still being set-up, an accurate data value will not be sampled. The present invention introduces a method of remedying this problem.

THE DELAY SHIFTER

Figure 3:
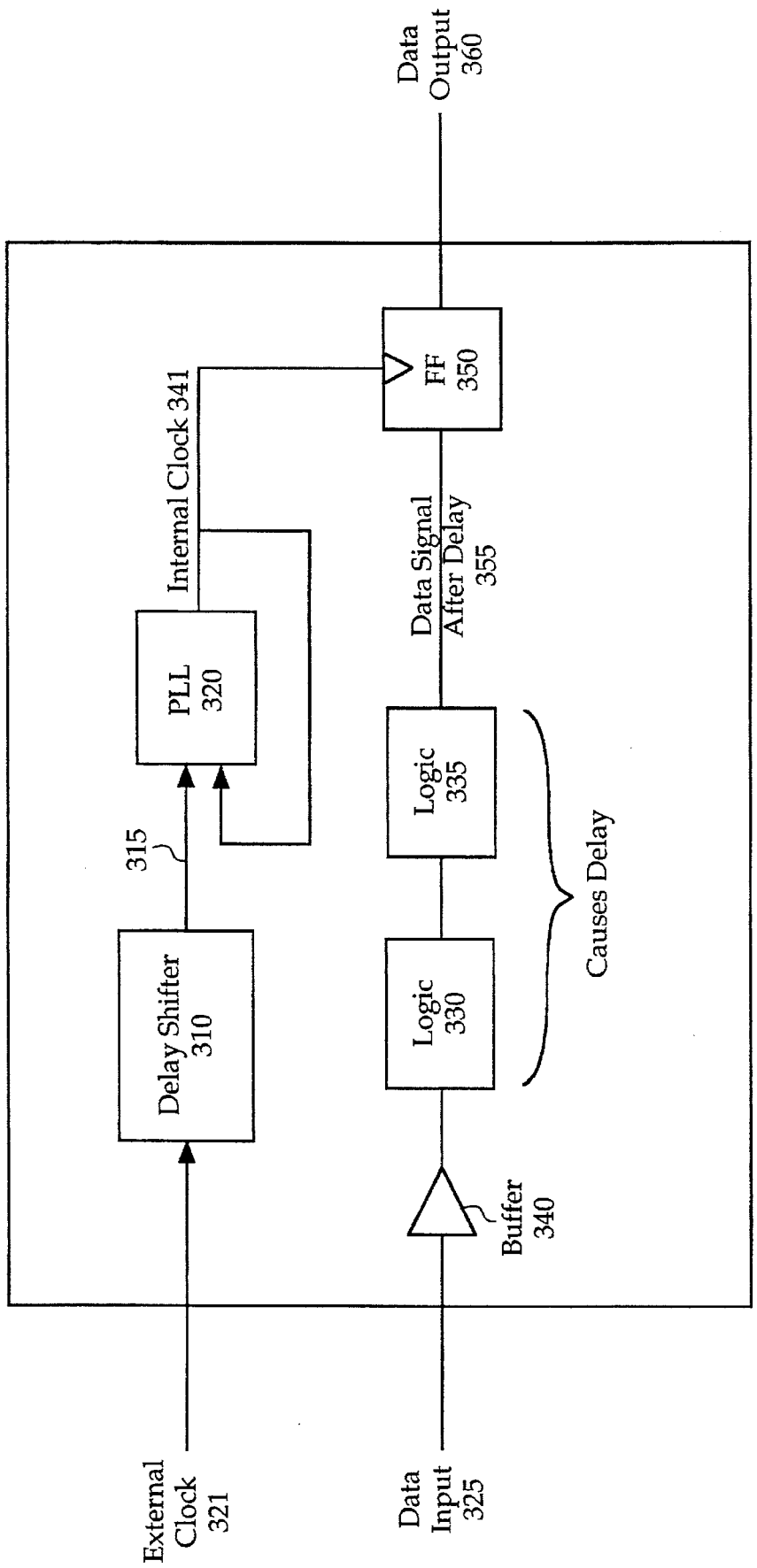
FIG. 3 illustrates a block diagram of the integrated circuit of Figure with the added delay shifter circuit.

FIG. 3 illustrates a digital integrated circuit with the delay shifter circuit 310 of the present invention. In the digital integrated circuit FIG. 3, the external clock line 321 first enters the integrated circuit and then passes through the delay shifter circuit 310. The delay shifter circuit 310 adds a certain intentional amount of propagation delay to the clock signal. The delayed clock signal 315 is then passed through phase lock loop 320 to stabilize it. The delay shifter circuit 310 should be design to have the same amount of delay that is added to the data signal by input buffer 340, logic 330 and logic 335. The delay shifter circuit 310 adds the appropriate amount of delay to the clock signal such that the delayed data signal 355 will be clocked at an appropriate time by at flip-flop 350 using the delayed internal clock line 341.

Figure 4:
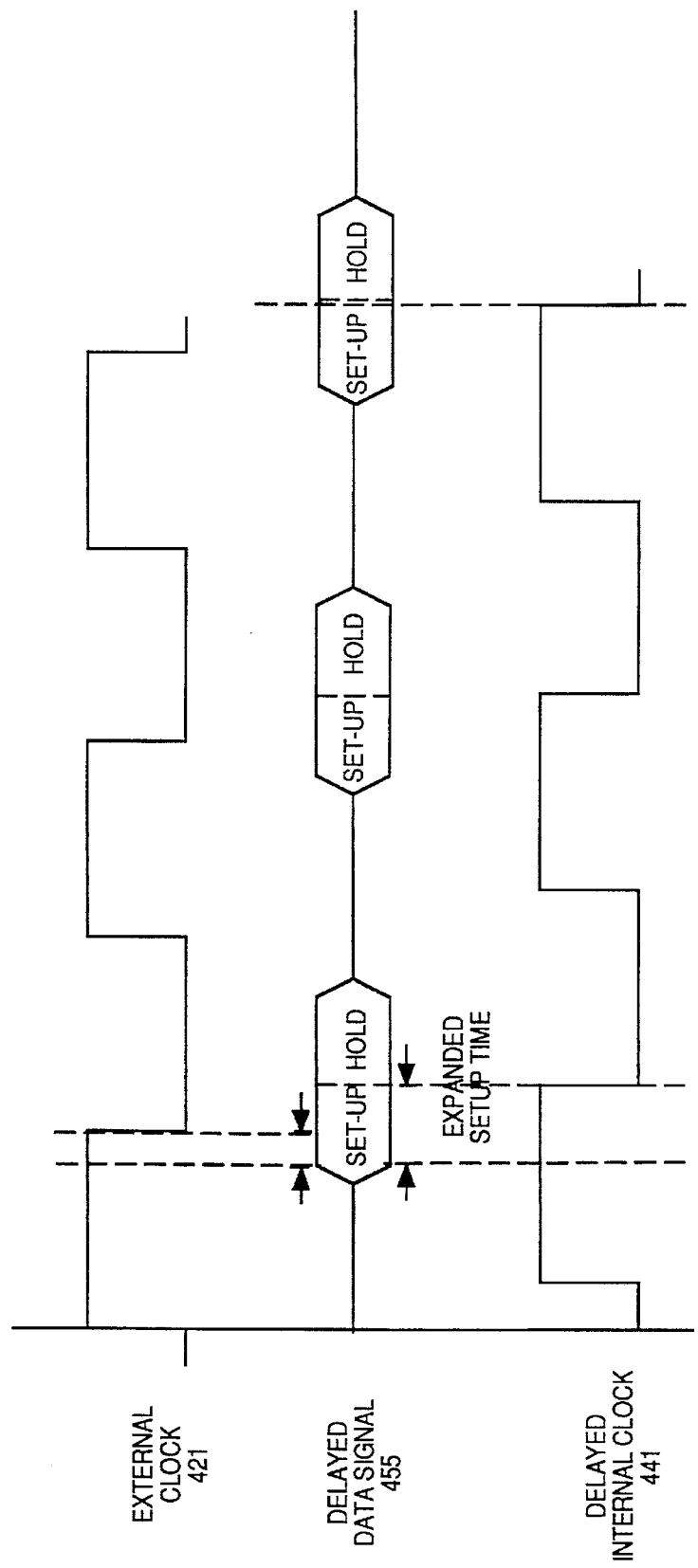
FIG. 4 illustrates a timing diagram of how the external clock signal, the delayed data signal, and the delayed clock signal appear.

FIG. 4 illustrates a timing diagram that explains the operating characteristics of the integrated circuit of FIG. 3. The external clock signal 421 enters as a simple square wave. A data signal accompanies the clock signal on data input line 325. However, after the data signal passes through the input buffer 340, logic 330, and logic 335 the data signal will appear as depicted by delayed data signal 455 in FIG. 4. To compensate it for the delayed data signal 455 the delay shifter circuit 310 of FIG. 3 delays the clock signal such that the internal clock signal after the delay shifter circuit 310 appears as delayed internal clock 441 illustrated in FIG. 4. Since the delayed internal clock 441 has been delayed by the same amount as the delayed data signal 455, the delayed data signal 455 will be given additional time for the set-up period. Thus, the delayed data signal 455 will be sampled at the appropriate time as illustrated in FIG. 4. Specifically, the second phase of the delayed internal clock signal 441 now matches up with the delayed data signal 455 during its hold state.

IMPLEMENTATION OF THE CLOCK SHIFTER

Figure 5:
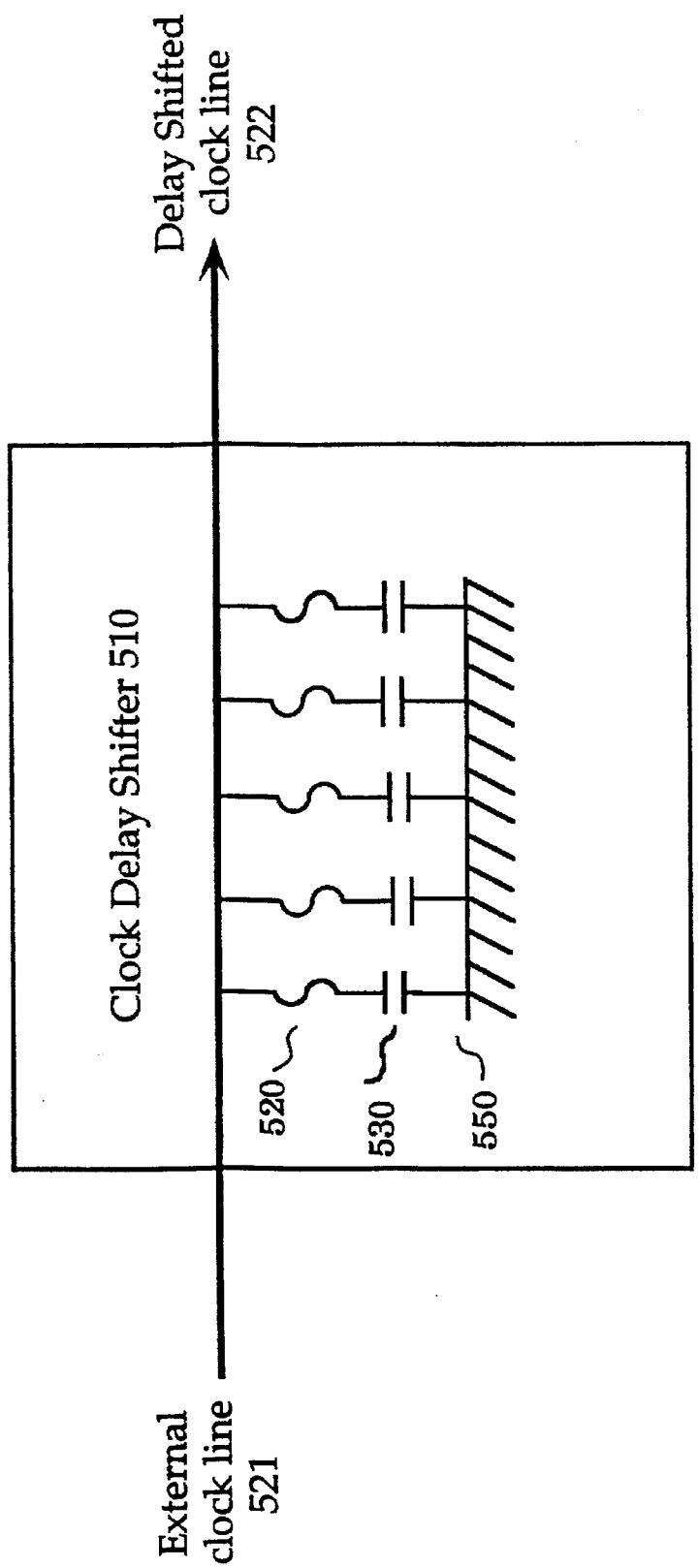
FIG. 5 is one possible implementation of a delay shifter circuit.

FIG. 5 illustrates one method of constructing a clock shifter in an integrated circuit. The clock shifter of FIG. 5 comprises a set of capacitors 530 that are coupled in parallel to ground 550 through a set of individual fuses 520. The fuses 520 are individually addressable such that each fuse can later be burned-out. The clock shifter 510 of FIG. 5 is adjustable after manufacture by using a set of control lines (not shown) that allow a user to burnout individual fuses 520 as needed such that the appropriate amount of propagation delay is introduce to the clock line. Ideally, the amount of capacitance on the clock line will delay the clock line an equal amount as the delay caused on the data input line.

When setting the delay introduced by the clock shifter circuit 510 6f FIG. 5, it is important not to introduce too much delay to the clock signal. If too much delay is added to the clock signal, then the delayed data signal 255 will be too skewed from the external clock signal such that external circuits will not be able to access it. Referring again to FIG. 3, the output of Flip-flop 350 is data output 360. If data output 360 is sampled by an external circuit (not shown) using the clock signal on external clock 321, then the data output 360 signal must closely correspond to the timing of external clock 321. Therefore, when adjusting the delay introduced by the clock shifter circuit 510, one must "bal-ance" the timing delay between propagation delay within the integrated circuit and the sampling tolerances of external circuit that samples a data signal from the integrated circuit.

In the foregoing specification the invention as been described with reference to specific exemplary embodiments thereof. It will, however, be evident that various modifications and changes may be made thereto without departing from the broader spirit and scope of the invention as set forth in the appended claims. The specification and drawings are, accordingly, to be regarded in an illustrative rather than restrictive sense.

What is claimed is:

1. An electrical circuit, said electrical circuit comprising the elements of:

a data path circuit, said data path circuit comprising the subelements of, one or more logic circuits, said logic circuits introducing propagation delay into said data path circuit;

a sampling circuit; and a clock circuit for driving said sampling circuit, said clock circuit comprising a delay shifter circuit, said delay shifter circuit introducing a delay time approximately equal to said propagation delay.

2. The electrical circuit as claimed in claim 1 wherein said delay shifter circuit comprises at least one capacitor coupled to a ground.

3. The electrical circuit as claimed in claim 2 wherein said delay shifter circuit further comprises a fuse coupled to each said capacitor, said fuse being individually addressable.

4. The electrical circuit as claimed in claim 1 wherein said sampling circuit comprises a flip-flop.

5. The electrical circuit as claimed in claim 1 wherein said clock circuit further comprises a phase locked loop.

6. A method for compensating for propagation delays in a data path, said method comprising the steps of:

passing a data signal through a data path comprising at least one logic gate, said data path introducing propagation delay onto said data signal, said data signal having an associated clock signal;

delay shifting said clock signal with a delay circuit to produce a delayed clock signal, said delayed clock signal delayed by a delay time approximately equal to said propagation delay; and sampling said data signal, said data signal sampled with said delayed clock signal.

7. The method for compensating for propagation delays as claimed in claim 6 wherein said associated clock signal is an external clock signal.

8. The method for compensating for propagation delays as claimed in claim 6 further comprising the steps of setting said delay time by burning fuses that couple said clock signal to a ground through a plurality of capacitors.

9. An electrical circuit, said electrical circuit comprising the elements of:

a data input;

a clock input for receiving a clock signal;

a data path circuit coupled to said data input, said data path generating a data output, said data path circuit introducing propagation delay;

a sampling circuit, said sampling circuit sampling said data output; and a clock shifter circuit coupled to said clock input, said clock shifter circuit introducing a delay time approximately equal to said propagation delay into said clock signal to produce a delayed clock signal, said delayed clock signal driving said sampling circuit.

10. The electrical circuit as claimed in claim 9 wherein said clock shifter circuit comprises at least one capacitor coupled to a ground.

11. The electrical circuit as claimed in claim 10 wherein said clock shifter circuit further comprises a fuse coupled to each said capacitor, said fuse being individually addressable.

12. The electrical circuit as claimed in claim 9 wherein said sampling circuit comprises a flip-flop.

13. The electrical circuit as claimed in claim 9 wherein said electrical circuit further comprises a phase locked loop, said phased locked loop stabilizing said clock signal.

* * * * *